(12) United States Patent
Morandini et al.

(10) Patent No.: US 8,981,529 B2
(45) Date of Patent: Mar. 17, 2015

(54) VARIABLE CAPACITANCE DEVICE

(71) Applicants: STMicroelectronics S.A., Montrouge (FR); International Business Machines Corporation, Armonk, NY (US)

(72) Inventors: Yvan Morandini, Chambery (FR); Romain Debrouke, le Sappey en Chartreuse (FR)

(73) Assignees: STMicroelectronics SA, Montrouge (FR); International Business Machines Corporation, Armonk, NY (US)

( * ) Notice: Subject to any disclaimer, the term of this patent is extended or adjusted under 35 U.S.C. 154(b) by 99 days.

(21) Appl. No.: 13/745,613

(22) Filed: Jan. 18, 2013

(65) Prior Publication Data

US 2013/0181784 A1 Jul. 18, 2013

(30) Foreign Application Priority Data

Jan. 17, 2012 (FR) ..................................... 12 50438

(51) Int. Cl.
*H01L 29/93* (2006.01)
*H01L 29/66* (2006.01)
*H03B 1/00* (2006.01)
*H03J 3/20* (2006.01)
*H03B 5/12* (2006.01)

(52) U.S. Cl.
CPC .......... *H01L 29/93* (2013.01); *H01L 29/66174* (2013.01); *H03B 1/00* (2013.01); *H03J 3/20* (2013.01); *H03B 5/1212* (2013.01); *H03B 5/1253* (2013.01); *H03J 2200/10* (2013.01)
USPC .......................................... 257/595; 438/379

(58) Field of Classification Search
USPC .......................................................... 257/601
See application file for complete search history.

(56) References Cited

U.S. PATENT DOCUMENTS

| | | | |
|---|---|---|---|
| 6,249,458 B1 * | 6/2001 | Shokouhi et al. | 365/185.23 |
| 6,753,738 B1 | 6/2004 | Baird | |
| 7,982,548 B2 * | 7/2011 | Athas | 331/117 FE |
| 8,222,963 B2 * | 7/2012 | Nakamura | 331/117 FE |
| 8,514,028 B2 * | 8/2013 | Ding et al. | 331/117 FE |
| 2002/0044012 A1 * | 4/2002 | Otsuka et al. | 327/586 |
| 2002/0171499 A1 * | 11/2002 | Momtaz et al. | 331/117 FE |
| 2006/0255865 A1 | 11/2006 | Li | |
| 2007/0075791 A1 | 4/2007 | Dedieu et al. | |
| 2010/0214715 A1 | 8/2010 | Thaller | |

OTHER PUBLICATIONS

French Search Report and Written Opinion dated Aug. 9, 2012 from corresponding French Application No. 12/50438.
French Search Report and Written Opinion dated Aug. 9, 2012 from related French Application No. 12/50442.

(Continued)

*Primary Examiner* — Stephen W Smoot
(74) *Attorney, Agent, or Firm* — Seed IP Law Group PLLC

(57) ABSTRACT

A variable capacitance device including: first and second transistors coupled in parallel between first and second nodes of the capacitive device, a control node of the first transistor being adapted to receive a control signal, and a control node of the second transistor being adapted to receive the inverse of the control signal, wherein the first and second transistors are formed in a same semiconductor well.

22 Claims, 3 Drawing Sheets

(56) References Cited

OTHER PUBLICATIONS

Waheed K et al: *Characterization of Deep-Submicron Varactor Mismatches in a Digitally Controlled Oscillator*, Custom Integrated Circuits Conference, 2005, Proceedings of the IEEE 2005, IEEE, Piscataway, NJ, USA, Sep. 18, 2005, pp. 600-603, XP010873599.

Maget, Judith et al: *Influence of Novel MOS Varactors on the Performance of a Fully Integrated UMTS VCO in Stand rd 1.25-μm CMOS Technology*, IEEE Journal of Solid-State Circuits, IEEE Service Center, Piscataway, NJ, USA, vol. 37, No. 7, Jul. 1, 2002, XP011065798.
Staszewski, R.B., et al. A Digitally Controlled Oscillator in a 90nm Digital CMOS Process for Mobile Phones, IEEE Journal of Solid-State Circuits, vol. 40, No. 11, Nov. 1, 2005, pp. 2203-2211, XP002681603.

\* cited by examiner

VARIABLE CAPACITANCE DEVICE

CROSS REFERENCE TO RELATED APPLICATIONS

This application claims the priority benefit of French patent application number 12/50438, filed on Jan. 17, 2012, which is hereby incorporated by reference to the maximum extent allowable by law.

BACKGROUND

1. Technical Field

The present disclosure relates to a variable capacitance device, and to a method of fabricating a variable capacitance device.

2. Discussion of the Related Art

Variable capacitance devices are used in a variety of applications, such as in the tuning circuits of voltage control oscillators used in wireless communication systems. It is often an aim of such variable capacitance devices to have a very fine step size between each capacitance value. In particular, in some applications it is desirable to attain a step size as low as 1 aF (AttoFarad, equal to $10^{-18}$ Farads).

FIGS. 1A, 1B and 1C illustrate a solution that has been proposed, as described in U.S. patent application 2007/075791, these figures respectively reproducing FIGS. 3, 1b and 1a of that patent application.

A variable capacitor 100 of FIG. 1A comprises a pair of variable-capacitance components 1 and 2 coupled in parallel between terminals 12a and 12b. Component 1 receives, via a line 3, a control signal $C_1$, which corresponds to a control signal C supplied to the variable capacitor 100. Component 2 receives a control signal $C_2$, which corresponds to the control signal C, after inversion by an inverter 4. Thus, at any time, the variable-capacitance components 1 and 2 are controlled by opposite signals.

FIG. 1B illustrates the variable-capacitance component 1 in more detail. As illustrated, component 1 comprises varactors 10a and 10b, each receiving the control signal $C_1$ on a line 11. Furthermore, terminals 13, 14a and 14b of the varactors, discussed in more detail below with reference to FIG. 1C, are coupled together. Component 2 is identical to component 1.

FIG. 1C illustrates in cross-section the varactor 1 in more detail. A lightly doped n-type well 102 is formed in a p-type semiconductor substrate 105, surrounded by an STI (Shadow Trench Isolation) 101. A central zone 103 and two lateral zones 104a, 104b situated in the well 102 are heavily doped n-type regions, these zones forming the terminals 13, 14a and 14b respectively of the varactor 1. A MOS gate is formed between the zones 104a and 103, and a further MOS gate is formed between the zones 103 and 104b. These gates respectively provide outputs to the terminals 12a and 12b of the device 100. The components 1 and 2 are differentiated by a configuration parameter, and thus, in operation, the respective variations in capacitance are different, leading to a variable capacitance of relatively low step size.

It would be desirable to provide a variable capacitance device having an even lower step size and/or an improved performance with respect to the circuits of the prior art.

SUMMARY

It is an aim of embodiments to at least partially address one or more drawbacks in the prior art.

According to one aspect, there is provided a variable capacitance device comprising: first and second transistors coupled in parallel between first and second nodes of said device, a control node of said first transistor being adapted to receive a control signal, and a control node of said second transistor being adapted to receive the inverse of said control signal, wherein said first and second transistors are formed in a same semiconductor well.

According to one embodiment, at least one dimension of said first transistor is different from the corresponding dimension of said second transistor.

According to another embodiment, the first and second transistors are dimensioned such that the capacitance between the first and second nodes differs by 1 aF or less between high and low states of said control signal.

According to another embodiment, a gate electrode of said first transistor has at least its width or its length different from that of the gate electrode of the second transistor.

According to another embodiment, the width or length of the gate electrode of said first transistor is between 1 and 10 percent greater than that of the gate electrode of the second transistor.

According to another embodiment, the variable capacitance device further comprises a first resistor coupled to a gate node of said first transistor for receiving said control signal, and a second resistor coupled to a gate node of said second transistor for receiving the inverse of said control signal.

According to another embodiment, the variable capacitance device further comprises a capacitor coupled in parallel with said first and second transistors.

According to another embodiment, the second node is adapted to be coupled to a supply voltage.

According to another embodiment, the first and second transistors are both n-channel MOS transistors or p-channel MOS transistors.

According to another embodiment, the variable capacitance device further comprises an inverter coupled between gate nodes of said first and second transistors.

According to a further aspect, there is provided an electronic device comprising: the above variable capacitance device; and a control block configured to generate the control signal for controlling said variable capacitance device.

According to a further aspect, there is provided a digitally controlled oscillator comprising: at least one inductor; and at least one of the above variable capacitance device.

According to a further aspect, there is provided a method of fabricating a variable capacitance device comprising: forming, in a semiconductor well surrounded by an isolation trench, first and second transistors; coupling main current nodes of each of said first and second transistors between first and second nodes of said variable capacitance device; and coupling an inverter between gate nodes of said first and second transistors, said inverter being adapted to receive a control signal.

According to one embodiment, the method further comprises coupling said second node to a supply voltage rail.

According to another embodiment, the method further comprises, prior to forming said first and second transistors, forming said semiconductor well, wherein either: said well is a p-type well, and said first and second transistors are n-channel transistors; or said well is an n-type well, and said first and second transistors are p-channel transistors.

BRIEF DESCRIPTION OF THE DRAWINGS

The foregoing and other purposes, features, aspects and advantages of the embodiments described herein will become apparent from the following detailed description, given by way of illustration and not limitation with reference to the accompanying drawings, in which.

DETAILED DESCRIPTION

Figure 1A:
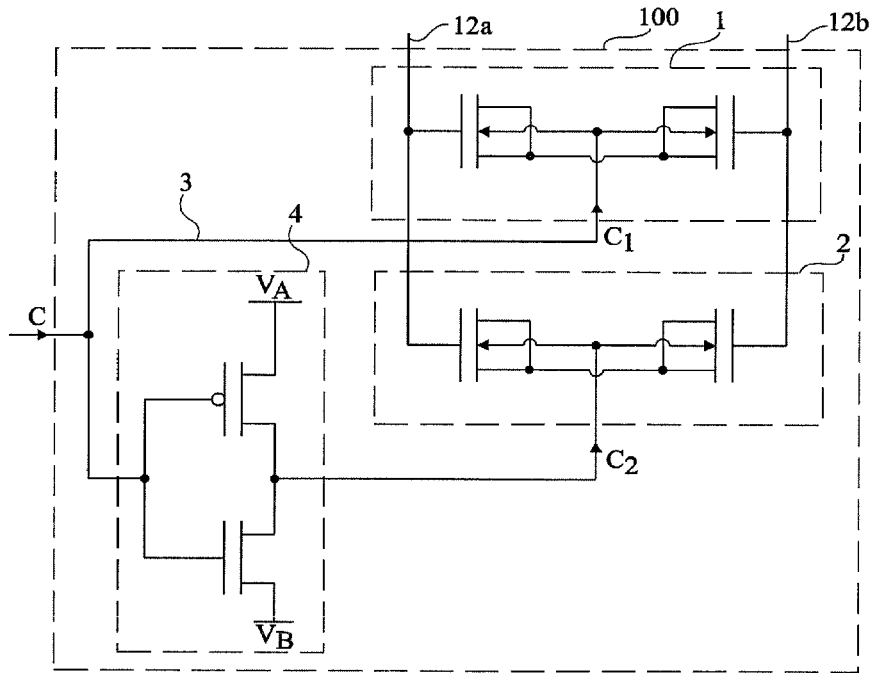
FIG. 1A, described above, schematically illustrates an example of a variable capacitor.
Figure 1B:
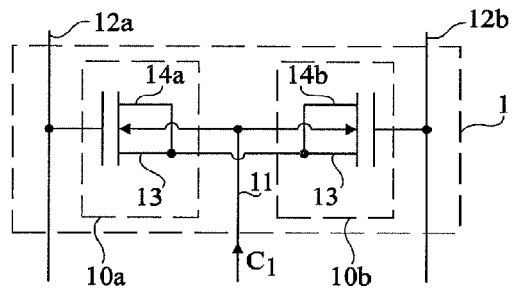
FIG. 1B, described above, illustrates a variable-capacitance component of the variable capacitor of FIG. 1A in more detail.
Figure 1C:
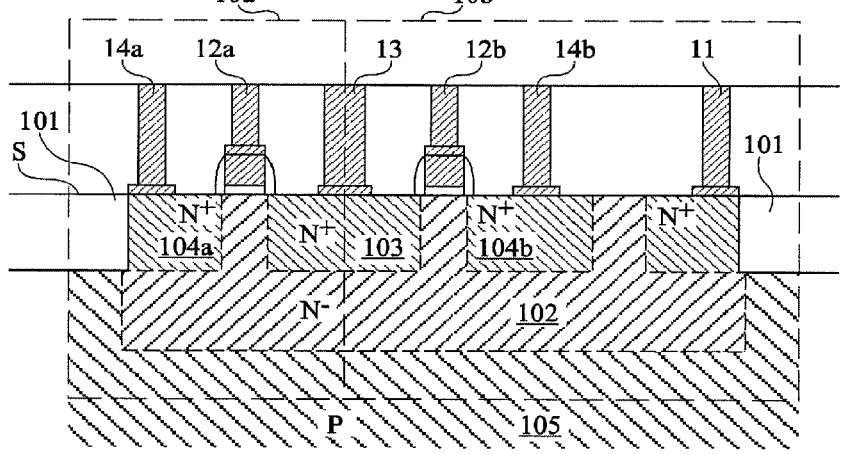
FIG. 1C, described above, is a cross-section schematically illustrating a varactor of the variable-capacitance component of FIG. 1B in more detail.
Figure 2:
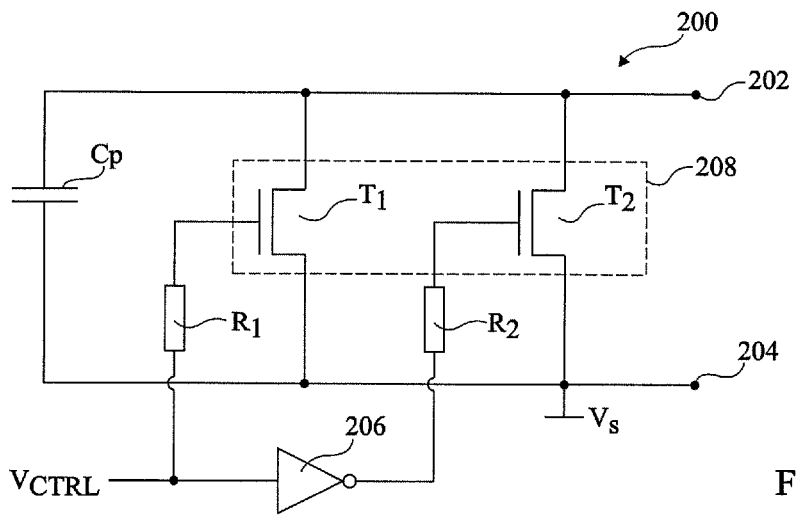
FIG. 2 illustrates a variable capacitance device according to an embodiment.

FIG. 2 illustrates a variable capacitance device 200 according to an embodiment of the present disclosure. Device 200 comprises transistors $T_1$ and $T_2$ coupled by their main current terminals between nodes 202 and 204 of the variable capacitance device. Node 204 is for example coupled to a supply voltage Vs, which is for example the ground voltage. A capacitor $C_P$ is optionally coupled in parallel with transistors $T_1$ and $T_2$ between nodes 202 and 204.

Transistor $T_1$ receives at its gate node, via a resistor $R_1$, a control signal $V_{CTRL}$. Transistor $T_2$ receives at its gate node, via the series connection of the resistor R2 and an inverter 206, the control signal $V_{CTRL}$. The resistors $R_1$ and $R_2$ for example have resistances in the order of 10 k ohms to 100 k ohms.

A dashed rectangle 208 in FIG. 2 represents a semiconductor well of the device 200 in which both of the transistors $T_1$ and $T_2$ are formed. In the example of FIG. 2, transistors $T_1$ and $T_2$ are both n-channel MOS transistors, and the well 208 is a p-type well. In alternative embodiments, the transistors $T_1$ and $T_2$ are p-channel MOS transistors, the well 208 is an n-type well, and the voltage $V_S$ is for example a supply voltage $V_{DD}$ rather than the ground voltage.

One or more further capacitors, not illustrated in FIG. 2, may also be coupled in parallel with capacitor $C_P$, for example each in series with a switch allowing it to be selected or not, thereby permitting a further selectable capacitance variation.

In operation, the high or low state of the control signal $V_{CTRL}$ determines which of the transistors $T_1$, $T_2$ is conducting and which is non-conducting. For example the high state corresponds to a voltage level of 1 V and the low state corresponds to a voltage level of 0 V, although other values would be possible. The capacitance of the transistor $T_1$ in the non-conducting state is for example slightly different from the capacitance of the transistor $T_2$ in the non-conducting state, and the same for example applies to the conducting states. This leads to a relatively small difference in the capacitance across nodes 202, 204, based on the state of the control signal $V_{CTRL}$. The slight difference between the capacitance values of transistors $T_1$, $T_2$ in the conducting and non-conducting states results for example from a difference in the dimensions of the transistors $T_1$, $T_2$, as will now be explained with reference to the examples of FIGS. 3 to 5.

Figure 3:
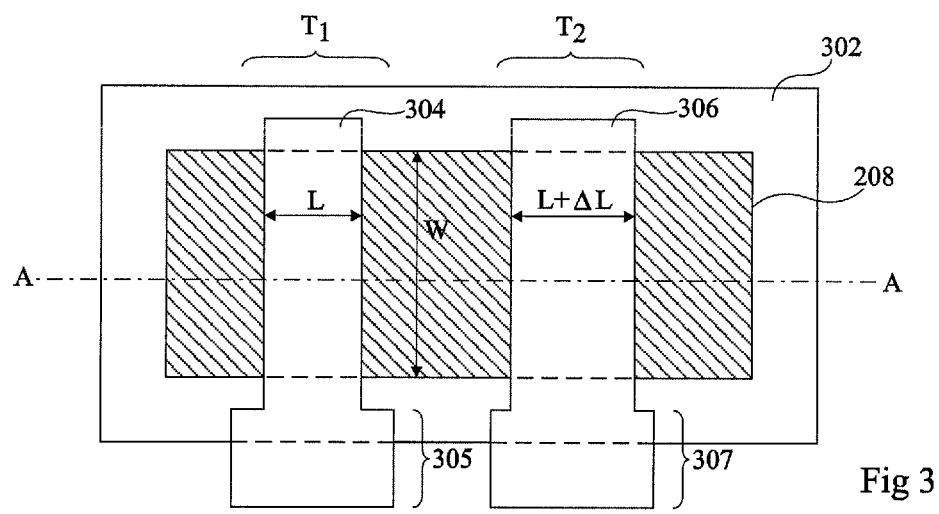
FIG. 3 schematically illustrates, in plan view, transistor devices of the variable capacitance device of FIG. 2 in more detail according to an embodiment.

FIG. 3 is a plan view showing the layout of the transistors $T_1$ and $T_2$ according to one example. The well 208 of FIG. 2 is shown, surrounded by an isolation trench 302, which is for example a shallow trench isolation (STI). Transistor $T_1$ comprises a gate electrode 304, which extends across the well 208, overlapping the isolation trench 302 at each extremity. The electrode 304 for example comprises, at one end, an enlarged region 305, to which a connection is made with a gate contact via (not shown in FIG. 3).

The width W of transistor $T_1$ corresponds to the width of the active regions of the device, shown by striped shading in FIG. 3, and which in this example corresponds to the width of the well 208. The portion of the gate electrode 304 that extends over the well 208 has, in the direction perpendicular to the direction in which it extends, a length L, which corresponds to the gate length of transistor $T_1$.

Transistor $T_2$ comprises a gate electrode 306, extending across the well 208 adjacent to and in a similar fashion to the gate electrode 304, overlapping the isolation trench 302 at each extremity. Gate electrode 306 also for example comprises an enlarged region 307 to which a connection is made with a gate contact via (also not shown in FIG. 3).

The width of transistor $T_2$ is the same as that of transistor $T_1$, being determined by the width W of the active region of well 208. However, the gate electrode 306 has a length L+ΔL, and thus the gate length of transistor $T_2$ is greater than that of transistor $T_1$ by length ΔL.

In one example, the length ΔL is for example equal to between 1 and 1000 percent of L, and preferably 10 percent or less of L. Furthermore, the length ΔL is for example equal to 3 nm or more. As an example, the gate length L is equal to approximately 30 nm, and the length ΔL is equal to between 3 and 300 nm, for example 10 nm or less.

Figure 4:
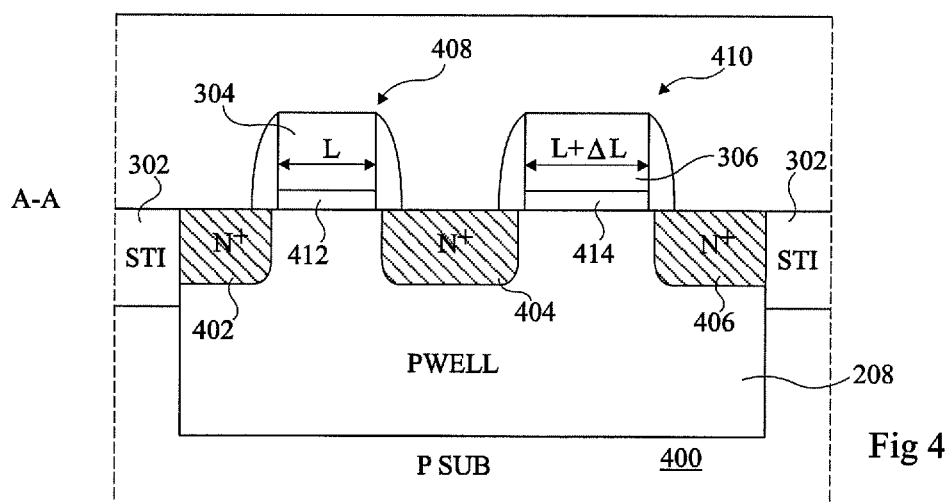
FIG. 4 schematically illustrates a cross-section of the structure of FIG. 3 according to an embodiment.

FIG. 4 illustrates a cross-section of the structure of FIG. 3, taken along a line A-A shown in FIG. 3, which extends across each of the gate electrodes 304, 306 in the direction of the gate length L. The well 208 is for example a lightly-doped p-type well formed over a p-type substrate 400, which meets the shadow trench isolation 302 at each side. Heavily doped n-type regions 402, 404 and 406 are formed in the p-type well 208, at its surface. A MOS gate stack 408 of transistor $T_1$ is formed between the $N^+$ regions 402 and 404, and a MOS gate stack 410 of transistor $T_2$ is formed between the $N^+$ regions 404 and 406. The gate stack 408 comprises gate electrode 304 of transistor $T_1$, which is separated from the surface of the p-type well 208 by an insulation layer 412, for example an oxide layer. Similarly, the gate stack 410 comprises the gate electrode 306 of transistor $T_2$, insulated from the p-type well 208 by an insulation layer 414, also for example an oxide layer.

A method of fabricating the structure of FIG. 4 for example comprises at least the steps of forming, in the semiconductor well 208 surrounded by the isolation trench 302, the transistors $T_1$ and $T_2$; coupling the main current nodes of the transistors $T_1$ and $T_2$ between the nodes 202 and 204 of the variable capacitance device of FIG. 2, for example by coupling regions 402 and 406 to node 202, and region 404 to node 204; and coupling an inverter between gate nodes of the transistors $T_1$ and $T_2$, the inverter being adapted to receive the control signal $V_{CTRL}$.

Figure 5:
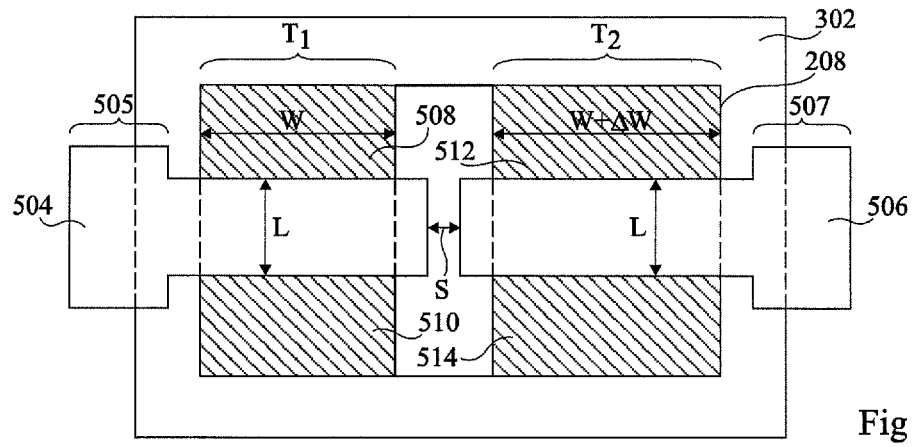
FIG. 5 schematically illustrates, in plan view, the transistor devices of the variable capacitance device of FIG. 2 in more detail according to an alternative embodiment.

FIG. 5 illustrates, in plan view, the structure of the transistors $T_1$ and $T_2$ according to an alternative embodiment. In the example of FIG. 5, the gate lengths L of the transistors $T_1$ and $T_2$ are the same, whereas the device widths W are different. The gate electrode 504 of transistor $T_1$ extends across the isolation trench 302 and part-way towards the opposite isolation trench, and the gate electrode 506 extends across the isolation trench from the other side towards gate electrode 504. Gate electrodes 504, 506 for example each comprise an enlarged region 505, 507 respectively, formed at an outer extremity, and each serving as a region to which a connection is made with a corresponding gate via (vias not being illustrated in FIG. 5). Transistor $T_1$ comprises active regions 508 and 510 in each side of the gate electrode 504, these active regions having a width W. Transistor $T_2$ comprises active regions 512 and 514 formed on each side of the gate electrode 506, these active regions having a width of W+ΔW. The space s between the gate electrodes 504 and 506 is for example of around 50 nm or more.

In one example, the width ΔW is for example equal to between 1 and 2000 percent of W, and preferably equal to 10 percent or less of W. Furthermore, the width ΔW is for example equal to 3 nm or more. In one example, the gate width W is equal to approximately 80 nm, and the width ΔW is for example between 3 and 1600 nm, for example 10 nm or less.

Figure 6:
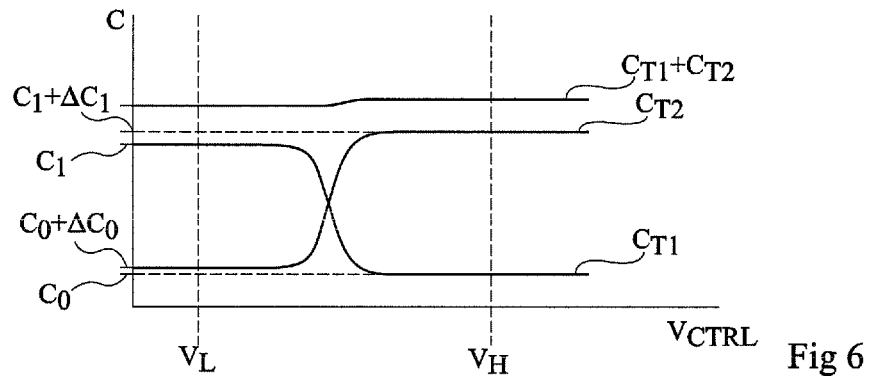
FIG. 6 is a graph illustrating examples of capacitance values corresponding to transistors of the variable capacitance device of FIG. 2.

FIG. 6 illustrates an example of capacitances of transistors $T_1$ and $T_2$ based on the state of the control signal $V_{CTRL}$. Assuming a low voltage state $V_L$ of signal $V_{CRTL}$, transistor $T_1$ is non-conducting and the capacitance $C_{T1}$ of transistor $T_1$ present across the nodes 202, 204 of FIG. 2 is at a relatively high level labeled $C_1$ in FIG. 6. Assuming a high voltage state $V_H$ of the control signal $V_{CTRL}$, transistor $T_1$ is conducting, and its capacitance $C_{T1}$ will be at a relatively low capacitance level labeled $C_0$ in FIG. 6.

When control signal $V_{CTRL}$ is at low state $V_L$, transistor $T_2$ is conducting, and the capacitance $C_{T2}$ of transistor $T_2$ present across the nodes 202 and 204 of FIG. 2 is at a relatively low level of $C_0+\Delta C_0$, in other words slightly greater that the capacitance level $C_0$ of transistor $T_1$ in the conducting state. Furthermore, when the control signal $V_{CTRL}$ is at high state $V_H$, transistor $T_2$ is non-conducting, and its capacitance $C_{T2}$ is at a relatively high level of $C_1+\Delta C_1$, in other words slightly higher than the capacitance level $C_1$ of transistor $T_1$ in the non-conducting state.

When the control signal $V_{CTRL}$ is at state $V_L$, the total capacitance of the variable capacitance device between the nodes 202 and 204 of FIG. 2 will thus be equal to $C_0+\Delta C_0+C_1$, and when the control signal $V_{CTRL}$ is at state $V_H$, the total capacitance will be equal to $C_0+C_1+\Delta C_1$. It can be assumed that, in general, the value of $\Delta C_1$ is greater than the value of $\Delta C_0$, which implies a difference of capacitance for the states $V_L$ and $V_H$ of the control signal $V_{CTRL}$ of $\Delta C=\Delta C_1-\Delta C_0$. The capacitance values $\Delta C_1$ and $\Delta C_0$ for example lead to a value of ΔC of around 1 aF or less.

Figure 7:
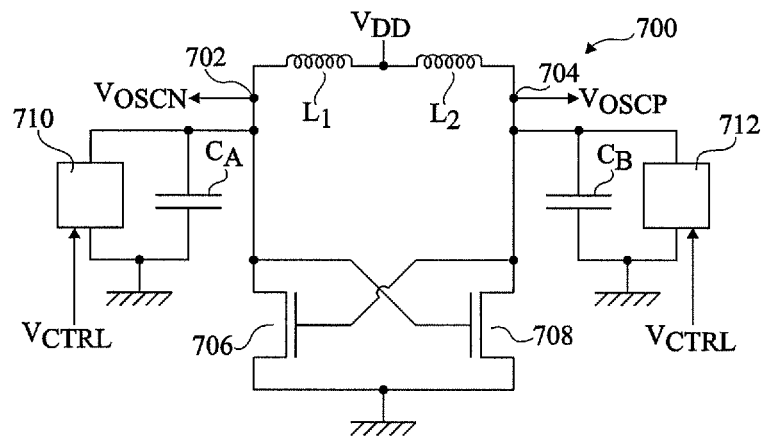
FIG. 7 schematically illustrates a digitally controlled oscillator according to an embodiment.

FIG. 7 illustrates a digitally controlled oscillator 700 according to an.

Digitally controlled oscillators are for example described in more detail in the publication entitled "A Digitally Controlled Oscillator in a 90 nm Digital CMOS Process for Mobile Phones", R. B. Staszewski et al., IEEE publication, vol. 40, No. 11, November 2005, the contents of which are hereby incorporated by reference to the extent permitted by the law.

Digitally controlled oscillator 700 comprises inductors $L_1$ and $L_2$, each coupled between a supply voltage $V_{DD}$ and respective output nodes 702 and 704. Nodes 702 and 704 are further coupled to a pair of cross-coupled transistors 706, 708, transistor 706 being coupled between node 702 and the ground voltage, and transistor 708 being coupled between node 704 and the ground voltage. The gate node of transistor 706 is coupled to node 704, while the gate node of transistor 708 is coupled to node 702.

A capacitor $C_A$ and a variable capacitance device 710 are each coupled between node 702 and the ground voltage. Furthermore, a capacitor $C_B$ and a variable capacitance device 712 are each coupled between node 704 and the ground voltage. The variable capacitance devices 710 and 712 for example each correspond to the device 200 of FIG. 2, with or without capacitor $C_p$, and each is controlled by the same control signal $V_{CTRL}$. Thus, in operation, the capacitance value at nodes 702 and 704 may be finely tuned between two or more states, based on the control signal $V_{CTRL}$, and thus lead to a fine control of the frequency at the output of the oscillator 700. In particular, the frequency f of the oscillator is determined as follows:

$$f = \frac{1}{2\pi\sqrt{LC}}$$

where L is the inductance of each of the inductors $L_1$, $L_2$, and C is the capacitance of each of the variable capacitance devices 710, 712. Thus the difference in frequencies $f_0$ and $f_1$ for the low and high states of the control signal $V_{CTRL}$ is as follows:

$$\Delta f = \frac{1}{2\pi\sqrt{LC_0}} - \frac{1}{2\pi\sqrt{LC_1}}$$

where $C_0$ and $C_1$ are the capacitances of the variable capacitance devices 710, 711 for the low and high states respectively of the control signal $V_{CTRL}$. As an example, assuming an inductance L of around 1 nH and a capacitance $C_0$ of around 10 fF, the frequency f would be in the order of 5 GHz. Assuming also a difference between the capacitance values $C_0$ and $C_1$ of around 1 aF, this would lead to a frequency step in the order of 100 kHz.

Figure 8:
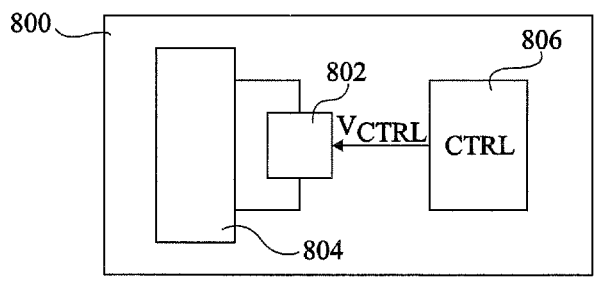
FIG. 8 illustrates an electronic device comprising a variable capacitance device according to an embodiment.

FIG. 8 illustrates an electronic device 800 comprising a variable capacitance device 802, which is for example the device 200 of FIG. 2. Device 802 is coupled to a circuit 804, which is for example a digitally controlled oscillator as described in relation to FIG. 7, or a different type of circuit such as a filter, which uses a variable capacitance device. Device 802 is controlled by the control signal $V_{CTRL}$, which is for example provided by a control block 806. The control signal $V_{CTRL}$ is for example generated based on any of a number of control techniques, such as a feedback loop etc.

An advantage of the embodiments described herein is that, by forming the variable capacitance device of a pair of transistors formed in a same semiconductor well, these transistors are well matched with each other over a range of operating conditions, such as temperature and voltage conditions. This means that a fine step size can be achieved over such a range of conditions.

Furthermore, by providing the capacitance step size based on a difference in dimensions of the pair of transistors controlled by opposite signals, a very fine step size can be achieved. In particular, a difference of gate length or of gate width equal to 10 percent or less between the gate electrodes of the transistors for example corresponds to a capacitance step size in the order of 1 aF.

Having thus described at least one illustrative embodiment, various alterations, modifications and improvements will readily occur to those skilled in the art.

For example, while embodiments of a variable resistance device comprising a pair of n-channel MOS transistors have been described, it will be apparent to those skilled in the art that the embodiments could instead use a pair of p-channel MOS transistors, and that the transistor technology could be different from MOS, for example bipolar.

Furthermore, it will be apparent to those skilled in the art that, depending on the application, the source nodes of transistors $T_1$ and $T_2$ may or may not be coupled to a supply voltage $V_S$, such as ground.

Furthermore, it will be apparent to those skilled in the art that a difference between the gate width or the gate length of transistors $T_1$ and $T_2$ is just one example. In alternative embodiments, both the width and length could differ, and/or other dimensions could differ between the transistors, such as the thicknesses of the gate oxide layers.

Furthermore, it will be apparent to, those skilled in the art that the layouts illustrated in FIGS. 3 and 5 are merely examples, and that other layouts would be possible.

The various features described in relation to the various embodiments could be combined, in alternative embodiments, in any combination.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A variable capacitance device comprising:
   a semiconductor well;
   a first node;
   a second node;
   a first transistor including a first control node, the first control node being configured to receive a control signal; and
   a second transistor including a second control node, the second control node being configured to receive an inverse of the control signal, the first and second transistors being coupled in parallel between the first and second nodes and arranged in the semiconductor well.

2. The variable capacitance device of claim 1 wherein at least one dimension of the first transistor is different from a corresponding dimension of the second transistor.

3. The variable capacitance device of claim 2 wherein the first and second transistors are dimensioned such that a capacitance between the first and second nodes differs by 1 aF or less between high and low states of the control signal.

4. The variable capacitance device of claim 1 wherein the first control node is a first gate electrode, the second control node is a second gate electrode, the first gate electrode having a width or length that is different from a width or length of the second gate electrode.

5. The variable capacitance device of claim 4 wherein the width or length of the first gate electrode is between 1 and 10 percent greater than the width or length of the second gate electrode.

6. The variable capacitance device of claim 1 wherein the first control node is a first gate node, the second control node is a second gate node, the variable capacitance device further including:

a first resistor coupled to the first gate node, the first resistor being configured to receive the control signal; and
   a second resistor coupled to the second gate node, the second resistor being configured to receive the inverse of the control signal.

7. The variable capacitance device of claim 1, further comprising a capacitor coupled in parallel with the first and second transistors.

8. The variable capacitance device of claim 1 wherein the second node is coupled to a supply voltage.

9. The variable capacitance device of claim 1 wherein the first and second transistors are both n-channel MOS transistors or p-channel MOS transistors.

10. The variable capacitance device of claim 1 wherein the first control node is a first gate node, the second control node is a second gate node, the variable capacitance device including an inverter coupled between the first and second gate nodes.

11. The variable capacitance device of claim 1 wherein the first control node is a gate of the first transistor, and the second control node is a gate of the second transistor.

12. An electronic device, comprising:
    a control block configured to generate a control signal; and
    a variable capacitance device coupled to the control block, the variable capacitance device including:
       a semiconductor well;
       a first node;
       a second node;
       a first transistor including a first control node, the first control node being configured to receive the control signal; and
       a second transistor including a second control node, the second control node being configured to receive an inverse of the control signal, the first and second transistors being coupled in parallel between the first and second nodes and arranged in the semiconductor well.

13. The electronic device of claim 12 wherein at least one dimension of the first transistor is different from the corresponding dimension of the second transistor, and a capacitance between the first and second nodes when the control signal is in a high state is higher or lower than a capacitance between the first and second nodes when the control signal is in a low state.

14. The electronic device of claim 12 wherein the variable capacitance device further includes:
    an inverter coupled to the second control node, the inverter being configured to receive the control signal and generate the inverse of the control signal.

15. A digitally controlled oscillator, comprising:
    a variable capacitance device including:
       a semiconductor well;
       a first node;
       a second node;
       a first transistor including a first control node, the first control node being configured to receive a control signal; and
       a second transistor including a second control node, the second control node being configured to receive an inverse of the control signal, the first and second transistors being coupled in parallel between the first and second nodes and arranged in the semiconductor well; and
    an inductor coupled to the variable capacitance device.

16. The digitally controlled oscillator of claim 15, further comprising:
    a third transistor coupled to the variable capacitance device and the inductor; and a fourth transistor coupled to the third transistor, the third transistor being cross-coupled to the fourth transistor.

17. The digitally controlled oscillator of claim 15, further comprising a capacitor coupled to the variable capacitance device.

18. A method, comprising:
    forming a semiconductor well;
    forming first and second transistors in the semiconductor well, the first transistor including a first control node being configured to receive a control signal, the second transistor including a second control node being configured to receive an inverse of the control signal; and
    coupling the first and second transistors in parallel between first and second nodes.

19. The method of claim 18, further comprising coupling the second node to a supply voltage rail.

20. The method of claim 18 wherein the
    semiconductor well is a p-type well and the first and second transistors are n-channel transistors, or the semiconductor well is an n-type well and the first and second transistors are p-channel transistors.

21. The method of claim 18, further comprising surrounding the semiconductor well with an isolation trench.

22. The method of claim 18, further comprising coupling an inverter between the first control node and the second control node, the inverter being configured to receive the control signal.

\* \* \* \* \*